(12) United States Patent
Eddahech et al.

(10) Patent No.: US 12,032,035 B1
(45) Date of Patent: Jul. 9, 2024

(54) METHOD FOR ESTIMATING THE RESISTIVE STATE OF HEALTH OF AT LEAST ONE ELECTRICAL ENERGY STORAGE ELEMENT OF AN ELECTRIC BATTERY

(71) Applicant: STELLANTIS AUTO SAS, Poissy (FR)

(72) Inventors: Akram Eddahech, Guyancourt (FR); Kodjo Senou Rodolphe Mawonou, Elancourt (FR)

(73) Assignee: STELLANTIS AUTO SAS, Poissy (FR)

( * ) Notice: Subject to any disclaimer, the term of this patent is extended or adjusted under 35 U.S.C. 154(b) by 0 days.

(21) Appl. No.: 18/566,946

(22) PCT Filed: Apr. 21, 2022

(86) PCT No.: PCT/FR2022/050753
§ 371 (c)(1),
(2) Date: Dec. 4, 2023

(87) PCT Pub. No.: WO2022/258895
PCT Pub. Date: Dec. 15, 2022

(30) Foreign Application Priority Data

Jun. 10, 2021 (FR) ...................................... 2106129

(51) Int. Cl.
*G01R 31/392* (2019.01)
*G01R 31/374* (2019.01)
(Continued)

(52) U.S. Cl.
CPC ......... *G01R 31/392* (2019.01); *G01R 31/374* (2019.01); *G01R 31/3842* (2019.01); *G01R 31/389* (2019.01)

(58) Field of Classification Search
None
See application file for complete search history.

(56) References Cited

U.S. PATENT DOCUMENTS

2008/0103709 A1* 5/2008 Yun ........................ H01M 10/48
702/63
2016/0327613 A1 11/2016 Tenmyo et al.

FOREIGN PATENT DOCUMENTS

CN 109725266 B 5/2021
EP 3605127 A1 2/2020
(Continued)

OTHER PUBLICATIONS

International Search Report for corresponding Int'l App. No. PCT/FR2022/050753 mailed Sep. 30, 2022.
(Continued)

*Primary Examiner* — Jas A Sanghera
(74) *Attorney, Agent, or Firm* — Sandberg Phoenix and von Gontard, P.C.

(57) ABSTRACT

The invention relates to a method, implemented in a management system of an electric battery of a vehicle, for estimating the resistive state of health of at least one electrical energy storage element, the method comprising the next steps: —determining (10) at least one operating range for which the direct current resistance of the element changes linearly with respect to the state of charge of the element and to temperature; —measuring (14) the variation in the strength and the voltage of an electric current generated by the element during a running phase of the vehicle; —calculating (16), based on the measured values of variation in strength and voltage, at least one direct current resistance value of the element; and —calculating (18) at least one value of the resistive state of health of the element based on the calculated direct current resistance value.

10 Claims, 3 Drawing Sheets

(51) Int. Cl.
*G01R 31/3842* (2019.01)
*G01R 31/389* (2019.01)

(56) References Cited

FOREIGN PATENT DOCUMENTS

| | | |
|---|---|---|
| EP | 3002597 A1 | 5/2020 |
| FR | 2965361 A1 | 3/2012 |
| FR | 2968769 A1 | 6/2012 |

OTHER PUBLICATIONS

Written Opinion for corresponding Int'l App. No. PCT/FR2022/050753 mailed Sep. 30, 2022.
Remmlinger et al, "On-board state-of-health monitoring of lithium-ion batteries using linear parameter-varying models", Journal of Power Sources, vol. 239, Nov. 30, 2012, pp. 689-695, XP028566892, DOI: 10.1016/J.JPOWSOUR.2012.11.102.

\* cited by examiner

METHOD FOR ESTIMATING THE RESISTIVE STATE OF HEALTH OF AT LEAST ONE ELECTRICAL ENERGY STORAGE ELEMENT OF AN ELECTRIC BATTERY

CROSS-REFERENCE TO RELATED APPLICATIONS

This application is the US National Stage under 35 USC § 371 of International Application No. PCT/FR2022/050753, filed Apr. 21, 2022, which claims the priority of French application No. 2106129 filed on Jun. 10, 2021, the content (text, drawings and claims) of both said applications being incorporated by reference herein.

BACKGROUND

Described herein is a method, implemented in an electric battery management system of a vehicle, for estimating the resistive state of health of at least one electrical energy storage element of said electric battery. Without this being limiting, the electrical energy storage element may for example be an electrical energy storage cell, an electrical energy storage module consisting of several storage cells connected in series, or an electric battery consisting of several storage modules connected in series. The electric battery is typically, but not limited to, a traction battery of the vehicle, in particular a lithium-ion battery.

In an electric or hybrid vehicle with an electric storage battery, a battery management system (BMS) must be provided. Such a system ensures the supervision of the state of health of the battery and of its safety in order to allow optimal operation of the battery without failure or risk for the user. The diagnosis of the battery carried out by such a system thus constitutes an important element making it possible to accurately optimize the use of the battery in order to reduce the repair costs and to prematurely prevent any major malfunction.

However, the degradation of the direct current resistance (DCR) of the battery determines the power levels that the latter is capable of providing. In this context, there is a need to be able to have an accurate estimation of the direct current resistance of the battery, in order to avoid overestimating the limits of the power that the battery will be able to provide in an aged condition.

To this end, a first known solution consists in performing a diagnosis of the battery on a dedicated test bench, first extracting the battery from the vehicle wherein it is normally installed and then applying current pulses to it in order to determine the direct current resistance of the battery. However, a disadvantage of such a diagnostic method on a test bench is that it requires using specific means (dedicated test bench) which are relatively expensive. Furthermore, such a method cannot be implemented during a normal phase of use of the vehicle, such as a running phase, and requires the vehicle to be immobilized in order to carry out the diagnosis, which is restrictive.

A second known solution consists in reconstructing the value of the direct current resistance of the battery from a model approach. Patent document EP 3-605-127 A1 describes, for example, a method and a device for implementing the method, wherein the direct current resistance of the battery is estimated by an algorithm using a parametric approach, in particular by interpolation or extrapolation. However, such a parametric estimation of the direct current resistance requires the use of complex and difficult algorithms to be carried out in real time within the electric battery management system installed in the vehicle.

SUMMARY

The purpose of the methods described herein is to overcome the disadvantages of the prior art by proposing a method, implemented in an electric battery management system of a vehicle, for estimating the resistive state of health of at least one electrical energy storage element of the electric battery, which is simple, robust and reactive and which can be implemented during vehicle running phases while making it possible to accurately estimate the limits of power that the battery is capable of providing in an aged state. The fact of estimating the resistive state of health (called SOHR in English for "State of Health Resistance") of at least one electrical energy storage element of the electric battery is more precise than estimating only the direct current resistance. In fact, the direct current resistance of the battery depends on the current, the state of charge (SOC), the temperature and the aging with a behavior that is sometimes highly non-linear at low state of charge, low temperatures and very high current values.

To do this, related herein is a method, implemented in an electric battery management system of a vehicle, for estimating the resistive state of health of at least one electrical energy storage element of said electric battery, the method comprising the next steps:
  determining at least one operating range for which the direct current resistance of said at least one electrical energy storage element changes linearly with respect to a pair of variables consisting of the state of charge of the storage element and the temperature;
  measuring, for several operating points of said at least one determined operating range and for a predefined duration, the variation of the strength and the voltage of an electric current generated by said at least one electrical energy storage element during at least one running phase of the vehicle;
  calculating, based on the measured values of variation in strength and voltage and for each of said operating points, at least one direct current resistance value of said at least one electrical energy storage element; and
  calculating, for each of said operating points, based on the direct current resistance value calculated for said operating point, at least one value of the resistive state of health of said at least one electrical energy storage element.

By exploiting measurements carried out during appropriate running times of the vehicle and for well-chosen operating ranges, the method makes it possible to obtain an accurate estimation of the resistive state of health of the electrical energy storage element. This makes it possible to avoid overestimating the power limits that the battery is capable of providing in an aged state and makes it possible to limit the acceleration of the battery aging accordingly. This also makes it possible to avoid any problems of undervoltage or voltage surge (risk of increased recurrences of a dysfunctional mode if the estimate of the resistive state of health and therefore of the power is not correct). The method thus contributes in particular to the second life of the electric battery, by making it possible to identify the degree of degradation of its direct current resistance. This makes it possible for example to sort the batteries in second life based on their resistive state of health value determined via the method. Moreover, the calculations carried out by the method are relatively simple calculations, which are carried out in real time and do not require the use of complex identification methods. Furthermore, the method is robust and also reactive because it makes it possible to detect defects of increased direct current resistance of the electrical energy storage element. Finally, because the method is implemented in an electric battery management system of the vehicle during running phases of the vehicle, it does not require the need to remove the battery from its frame to determine its resistive state of health, contrary to certain methods of the prior art.

Preferably, the step of measuring the variation in the strength and the voltage of an electric current is carried out during a dynamic driving cycle of the vehicle.

Advantageously, during the step of determining at least one operating range for which the direct current resistance of said at least one electrical energy storage element changes linearly, said at least one determined operating range is an operating range for which the direct current resistance of said at least one electrical energy storage element changes linearly with respect to the state of charge of the storage element, temperature and strength of the electric current. This makes it possible to better control the behavior of the direct current resistance of the electrical energy storage element, and thus to improve the accuracy of the method.

Preferably, the method further comprises a step of verifying, for each of said operating points, at least one condition fulfilled by the strength and/or the voltage of the electric current generated by said at least one electrical energy storage element, said verification step being carried out between the determination step and the measuring step, the measurement of the variation of the strength and of the voltage of the generated electric current being carried out if said at least one condition is verified.

According to a particular technical feature, a first condition to be verified consists in that the value of the strength of the electrical current generated is less than a threshold value close to zero over a first predefined period, and a second condition to be verified consists in that the strength and the voltage of the generated electrical current each have a constant or quasi-constant value over a second predefined period.

According to another particular technical feature, a third condition to be verified consists in that, at the end of the second predefined period, the value of the strength of the generated electrical current is less than a threshold value of maximum strength, and/or the variation in the strength of the electrical current between the start and the end of the second predefined period is greater than a threshold variation value. Verification of the first sub-condition of this third condition makes it possible to comply with the non-linearity due to the high current on the direct current resistance of the electrical energy storage element. Verification of the second sub-condition of this third condition makes it possible to obtain a sufficiently significant signal-to-noise ratio so as not to impair the accuracy of the estimate.

Advantageously, the measurement step is carried out for several running phases of the vehicle, and the step of computing at least one resistive state of health value comprises a first calculation phase, for each of said operating points, several intermediate resistive state of health values, each intermediate resistive state of health value being associated, for said operating point, with a running phase and with the measured strength variation value for this running phase, and a second calculation phase, for each of said operating points, based on said intermediate resistive state of health values calculated for said operating point, of a resistive state of health value of said at least one electrical energy storage element. This makes it possible to perform robust filtering of the raw values of calculated intermediate resistive states of health, which makes estimating the resistive state of health of the electrical energy storage element more stable and more accurate for the operating point under consideration. Indeed, the fact of multiplying the running phases during which the measurements are carried out makes it possible to provide a minimum number of distinct strength values making it possible to guarantee efficient and robust filtering. Each strength value is associated with a distinct running phase, and for each distinct strength value an intermediate resistive state of health value is calculated for the relevant operating point. The impact of the strength of the electrical current on the value of the direct current resistance of the electrical energy storage element is then taken into consideration.

According to another particular technical feature, the second phase of calculating the step of calculating a resistive state of health value of said at least one electrical energy storage element consists in applying an average over the set of intermediate resistive state of health values calculated during the first calculation phase, and of weighting this average based on the strength variation values associated with said intermediate resistive state of health values. This second calculation phase makes it possible to make the estimation of the resistive state of health of the electrical energy storage element even more stable for the operating point under consideration.

According to another particular technical feature, the first calculation phase, for each running phase wherein a measurement is carried out, of an intermediate resistive state of health value, consists in dividing the calculated direct current resistance value for this running phase by a predetermined direct current resistance value at the start of life of the electric battery.

Preferably, said at least one electrical energy storage element is chosen from the group consisting of: an electrical energy storage cell, an electrical energy storage module consisting of several storage cells connected in series, and an electric battery consisting of several storage modules connected in series. When the electrical energy storage element is an electrical energy storage cell, this makes it possible for example to detect cell production problems in the factory. When the electrical energy storage element is an electrical energy storage module, information can then be obtained as to the degradation of the direct current resistance of a replaceable unit of the electric battery (in this case, the module), which makes it possible to facilitate and guide after-sale diagnostic tools. In addition, such a module consisting of several storage cells connected in series has more homogeneous thermal characteristics (a factor that plays on the value of the direct current resistance) compared with a storage cell considered individually.

BRIEF DESCRIPTION OF THE FIGURES

A description will be given below, by way of non-limiting examples, of embodiments a battery management system for a vehicle, with reference to the attached figures wherein.

DETAILED DESCRIPTION

Figure 1:
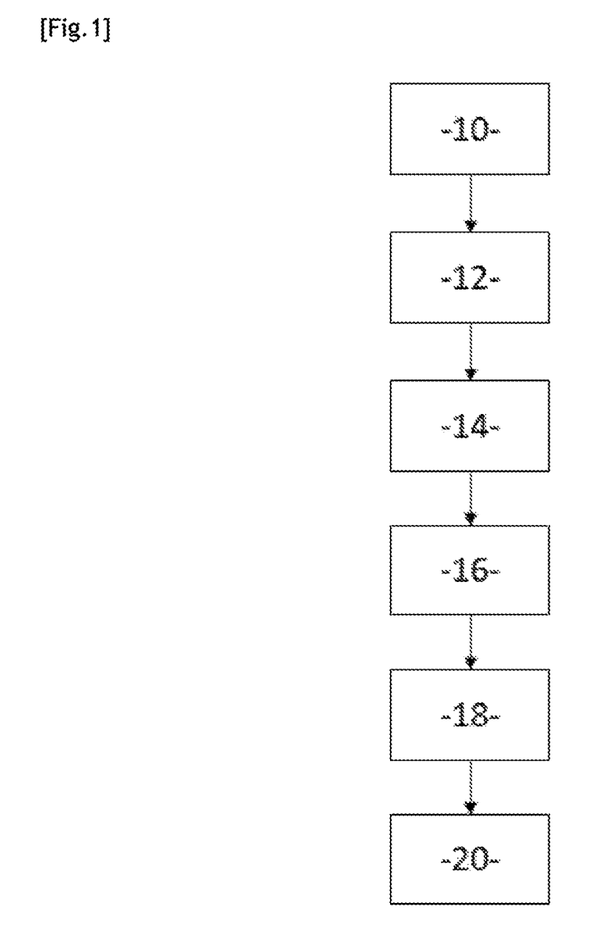
FIG. 1 is a flowchart showing a method for estimating the resistive health status of at least one electrical energy storage element of an electric battery.

Referring to FIG. 1, disclosed herein is a method, implemented in an electric battery management system of a vehicle, for estimating the resistive state of health of at least one electrical energy storage element of the electric battery. Without limitation, the electrical energy storage element may for example be an electrical energy storage cell, an electrical energy storage module consisting of several storage cells connected in series, or the electric battery itself. The electric battery is typically, but not limited to, a traction battery of the vehicle, in particular a lithium-ion battery. The vehicle is typically an electric vehicle or a hybrid vehicle. The system for managing the electric battery is provided with memory means and processing means connected to the memory means, such means not being shown in the figures for reasons of clarity. The method is implemented during at least one running phase of the vehicle.

Figure 2:
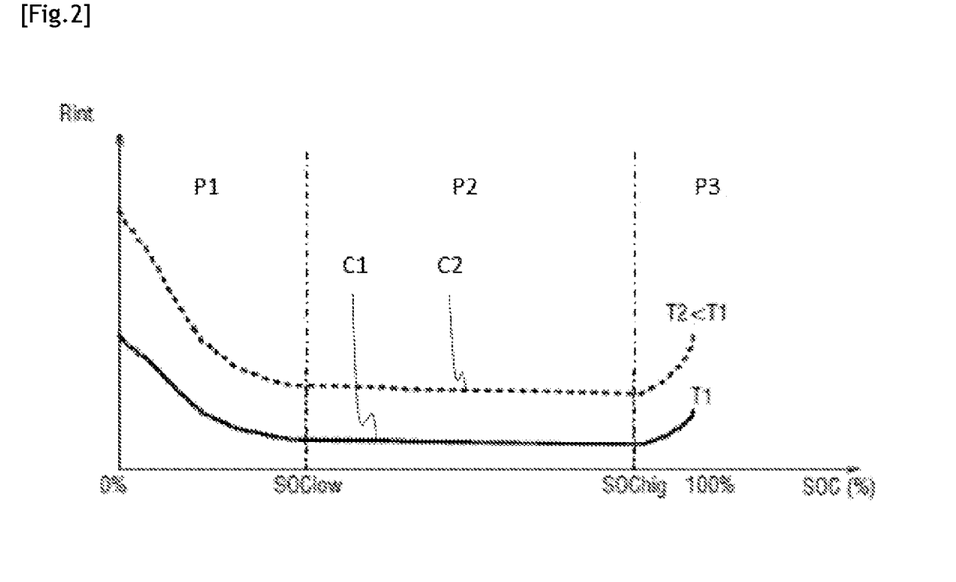
FIG. 2 is a diagram showing the evolution of the direct current resistance of the electrical energy storage element based on its state of charge, for different temperature values.

The method comprises a first step 10 during which the battery management system determines at least one operating range for which the direct current resistance of the electrical energy storage element changes linearly with respect to at least one pair of variables consisting of the state of charge of the storage element and of the temperature. For example, FIG. 2 shows the evolution of the direct current resistance Rint of the electrical energy storage element as a function of its state of charge SOC (in %), for two temperature values T1, T2 (thus defining two distinct curves C1, C2), when the element is an electrical energy storage cell. A first temperature T1 is lower than a second temperature T2. In FIG. 2, two particular threshold values are indicated for the state of charge SOC: a first threshold value $SOC_{low}$ corresponding to a low charge threshold of the storage cell, and a second threshold value $SOC_{hig}$ for which the storage cell is 100% charged. Preferably, the first threshold value $SOC_{low}$ is chosen to be lower than the minimum cell charge state value from the set of electrical energy storage cells of the battery, and the second threshold value $SOC_{hig}$ is chosen to be higher than the maximum cell charge state value from all of the electrical energy storage cells of the battery.

As can be seen in FIG. 2, each of the two curves C1, C2, corresponding respectively to the first and the second temperature T1, T2, defines three distinct operating ranges: a first operating range P1 when the state of charge SOC is lower than the first threshold value $SOC_{low}$, wherein the direct current resistance Rint evolves almost linearly with respect to the pair of variables consisting of the state of charge SOC and of the temperature; a second operating range P2 when the state of charge SOC is between the first threshold value $SOC_{low}$ and the second threshold value $SOC_{hig}$, wherein the direct current resistance Rint evolves linearly with respect to the temperature and constantly with respect to the state of charge SOC; and a third operating range P3 when the state of charge SOC is higher than the second threshold value $SOC_{hig}$, wherein the direct current resistance Rint evolves linearly with respect to the temperature and almost exponentially with respect to the state of charge SOC. In this exemplary embodiment, the first operating range P1 can thus be the operating range selected by the battery management system during the first step 10.

Preferably, during this first step 10, each determined operating range is an operating range for which the direct current resistance of the electrical energy storage element evolves linearly not only with respect to the pair of variables consisting of the state of charge of the storage element and the temperature, but also with respect to the strength of the electric current generated by the storage element.

This first determination step 10 allows the battery management system to dispense with any possible temperature measurement and estimation of the state of charge of the electrical energy storage element.

Figure 3:
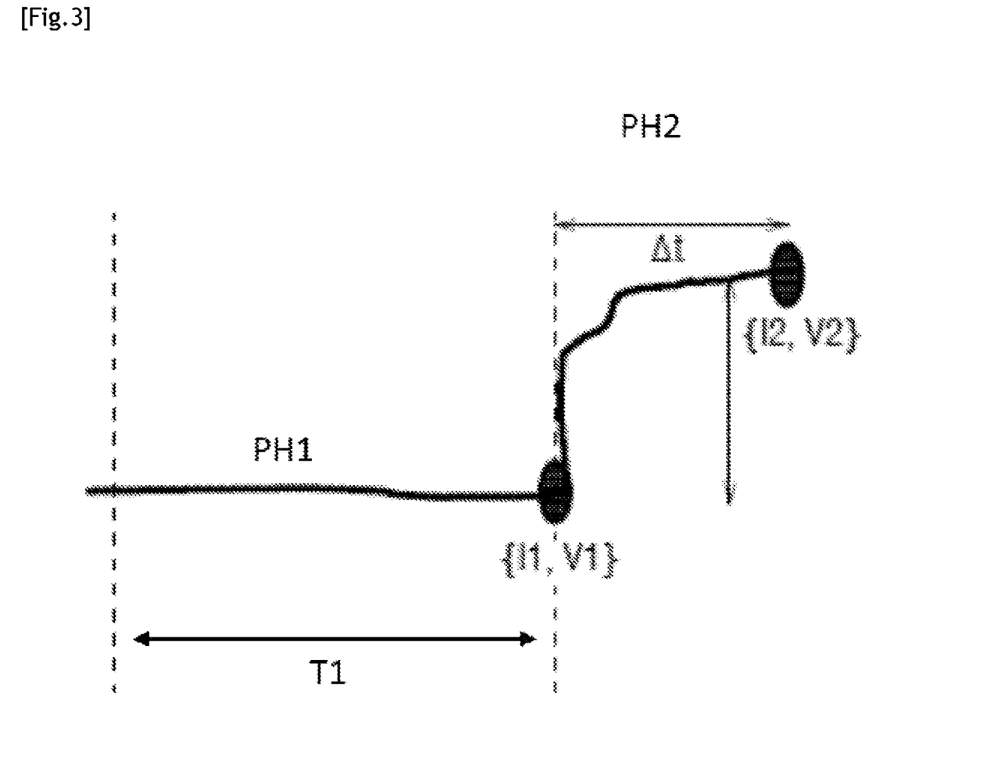
FIG. 3 is a diagram showing the evolution based on time of the strength and voltage of the electrical current generated by the electrical energy storage element during a running phase of the vehicle, and illustrating a step of the method of FIG. 1.

Preferably, the method comprises a next step 12 during which the battery management system verifies, for several operating points of each operating range determined during step 10, whether at least one condition is fulfilled by the strength and/or the voltage of the electric current generated by the electrical energy storage element. Advantageously, as shown in FIG. 3, a first condition to be verified is that the value I1 of the strength of the electrical current generated is lower than a threshold value close to zero over a first predefined period T1, and a second condition to be verified is that the strength and the voltage of the generated electrical current each have a constant or quasi-constant value I2, V2 over a second predefined period Δt. In the diagram of FIG. 3, the first condition is substantiated by the phase PH1, and the second condition is substantiated by the following phase PH2. Preferably, the battery management system verifies, for each of the operating points of the current operating range, whether a third condition is verified. The third condition consists in verifying that, at the end of the second predefined period Δt, the value I2 of the strength of the generated electrical current is less than a threshold value of maximum strength, and/or that the variation in the strength of the electrical current between the start and the end of the second predefined period Δt is higher than a threshold variation value. In the example of FIG. 3, this variation in the strength corresponds to the value given by I2-I1.

The method comprises a next step 14 which is carried out if said at least one condition is verified during the preceding step 12. If this is not the case, the method repeats step 12 for another operating point, or even loops back to the first step 10 if the condition is not verified for any operating point in the current operating range. During this next step 14, the battery management system measures, for each of the operating points of the current operating range and for a predefined duration, the variation in the strength and the voltage of the electric current generated by the electrical energy storage element during the current running phase of the vehicle. In the example of FIG. 3, the predefined duration during which the measurement is performed is the second predefined duration Δt.

When the storage element is an electrical energy storage module, the measured voltage variation is the maximum voltage variation value from all the electrical energy storage cells of the module. When the storage element is the electric battery itself, the measured voltage variation is the maximum voltage variation value from all the electrical energy storage cells of the battery. This latter scenario advantageously makes it possible to take into account constraints defined in an on-board diagnostic (OBD) system of the vehicle, such as for example a loss of power when the vehicle is a hybrid vehicle of the PHEV type (Plug-in Hybrid Electric Vehicle).

Preferably, this measuring step 14 is carried out during a dynamic driving cycle of the vehicle. More preferably, this measuring step 14 is carried out for several running phases of the vehicle, the preceding steps 10, 12 being carried out for each of these running phases. Each measurement of the variation in the strength and the voltage of the electrical current generated by the electrical energy storage element is then associated with a distinct running phase. Each measurement, associated with a distinct running phase, is also associated with a corresponding electrical current strength value. Preferably, the number of running phases for which the measurement is carried out during step 14 is greater than or equal to four.

During a next step 16, the battery management system calculates, based on the measured strength and voltage variation values and for each operating point of the current operating range, at least one direct current resistance value of the electrical energy storage element. When the measuring step 14 is carried out for several vehicle running phases, during step 16 the battery management system calculates several direct current resistance values for each of the operating points of the current operating range. More specifically, for each operating point of the current operating range, the battery management system calculates as many direct current resistance values as there are running phases during which a measurement is carried out. For a given operating point (state of charge value, temperature value), there are therefore several calculated direct current resistance values, each direct current resistance value being associated with an electrical current strength value corresponding to a distinct running phase. For each operating point, each direct current resistance value is for example calculated by dividing the voltage variation measured during step 14 for the corresponding running phase, by the strength variation measured during this same step. As a variant, for each operating point, each direct current resistance value can be calculated by carrying out interpolation or linear regression over several current strength points all corresponding to a given running phase, and for which the measurements described in step 14 were carried out. The various current strength points can be spaced apart on a scale from a minimum current strength value corresponding to the minimum strength to be considered to guarantee a sufficiently significant signal-to-noise ratio, to a maximum current strength value corresponding to the maximum strength to be considered so as not to cause non-linearity on the calculated direct current resistance value. It is possible to configure a minimum number of scatter plots in the voltage/current axis from which the linear regression is activated. The spacing between the current strength points can be evenly distributed based on the percentage relative to the maximum current strength value. A least squares type algorithm can be used for linear regression.

Figure 4:
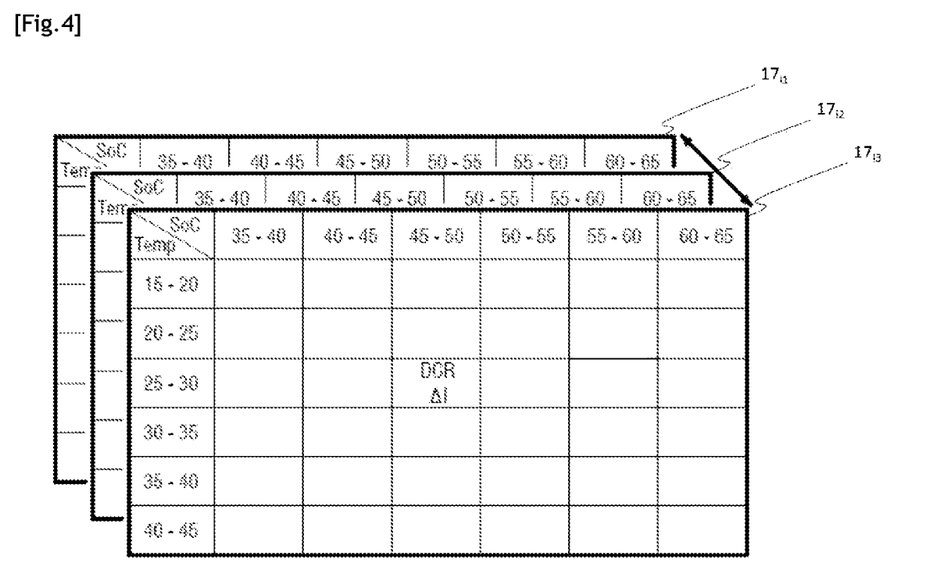
FIG. 4 is a schematic view showing a series of tables stored in a memory of an electric battery management system, and illustrating a step of the method of FIG. 1.

As shown in FIG. 4, the various values of the calculated direct current resistance DCR are then stored in tables $17_{i1}$, $17_{i2}$, $17_{i3}$ pre-established in the memory means of the battery management system. Each table $17_{i1}$, $17_{i2}$, $17_{i3}$ defines several operating points (the rows of the table defining temperature values Temp, and the columns of the state of charge SoC values) and corresponds to a distinct running phase associated with a specific electrical strength value i1, i2, i3. Each calculated direct current resistance value DCR is stored in one of the tables $17_{i1}$, $17_{i2}$, $17_{i3}$ by associating it with the corresponding strength variation value DI measured during step 14.

During a next step 18, the battery management system calculates, for each of the operating points of the current operating range, based on the direct current resistance value calculated for this operating point, at least one resistive state of health value of the electrical energy storage element. When the measuring step 14 is carried out for several running phases of the vehicle, the battery management system calculates, during a first phase of step 18 and for each of the operating points of the current operating range, several intermediate resistive state of health values. More specifically, for each operating point of the current operating range, the battery management system calculates as many intermediate resistive state of health values as there are running phases during which a measurement is carried out. For a given operating point (state of charge value, temperature value), there are therefore several intermediate resistive state of health values calculated, each intermediate resistive state of health value being associated with a value of electric current strength corresponding to a distinct running phase. For each operating point, each intermediate resistive state of health value $SOHR_i$, corresponding to a given running phase i is for example calculated by dividing the direct current resistance value $DCR_i$ calculated during step 16 for this running phase by a predetermined direct current resistance value $DCR_{BOL}$ at the start of life of the electric battery. For each operating point, each intermediate resistive health value $SOHR_i$ is then expressed according to the following equation (1):

[Math]

$$SOHR_i = 100 \times \frac{DCR_i}{DCR_{BOL}} \quad (1)$$

Each predetermined direct current resistance value $DCR_{BOL}$ corresponds to a given operating point (state of charge, temperature) and is derived from a typical characterization carried out at each cell of the electric battery at the start of life of the battery.

Each calculated intermediate resistive state of health value SOHR is then stored in one of the tables $17_{i1}$, $17_{i2}$, $17_{i3}$, together with the corresponding direct current resistance value $DCR_i$ or instead of this value, and by associating it with the corresponding strength variation value Ali measured during step 14. The battery management system then calculates a resistive state of health value during a second phase of step 18 and for each of the operating points of the current operating range, based on the intermediate resistive state of health values calculated during the first phase for this operating point. For each operating point, the resistive state of health value SOHR is for example calculated by applying an average over all the intermediate resistive state of health values $SOHR_i$, calculated during the first calculation phase of step 18, and by weighting this average based on the strength variation values Ali associated with these intermediate resistive state of health values $SOHR_i$. For each operating point, the resistive state of health value SOHR is then expressed according to the following equation (2):

[Math]

$$SOHR = \frac{\sum_i^N SOHR_i \times \Delta I_i}{\sum_i^N \Delta I_i} \quad (2)$$

N being the number of calculated intermediate resistive state of health values $SOHR_i$, in other words the number of running phases taken into account. In the example of FIG. 4, the number N is thus equal to three. The resistive state of health values SOHR are then stored in a single table listing all of the operating points.

Preferably, the method comprises a next step 20 during which the battery management system calculates a final resistive state value of the electrical energy storage element, based on the resistive state of health values SOHR calculated for the different operating points during the preceding step 18. The final resistive state value is for example calculated as the average of the set of resistive state of health values SOHR calculated for the various operating points.

Steps 10 to 20 were described above with reference to operating points considered according to the pair of variables: state of charge, temperature. Alternatively, these same steps 10 to 20 can be implemented in an analogous manner by taking into account operating points considered according to the set of three variables: state of charge, temperature, strength of a battery charging or discharging current. The strength of the battery charging or discharging current is for example a binary variable whose value indicates the direction of polarization of the electric current flowing in the battery. The current may be a battery charging or discharging current during a running phase of the vehicle, a charging current typically flowing in the battery during a regenerative braking mode of the vehicle. The tables stored in the memory means of the battery management system then define operating points in three dimensions corresponding to these three variables. During the computing step 20, the battery management system then calculates two final resistive health status values of the electrical energy storage element, a first value corresponding to a charging current of the electric battery, a second value corresponding to a discharging current of the electric battery.

The method is simple to implement during vehicle running phases, and is an accurate, robust and reactive method that makes it possible to accurately estimate the limits of the power that the battery is capable of providing in an aged state.

The invention claimed is:

1. A method, implemented in an electric battery management system of a vehicle, of estimating the resistive state of health of at least one electrical energy storage element of said electric battery, wherein the method comprises the next steps:
   determining at least one operating range for which the direct current resistance of said at least one electrical energy storage element changes linearly with respect to a pair of variables consisting of the state of charge of the storage element and of the temperature;
   measuring, for several operating points of said at least one determined operating range and for a predefined duration, the variation in the strength and the voltage of an electric current generated by said at least one electrical energy storage element during at least one running phase of the vehicle;
   calculating, based on the measured values of variation in strength and voltage and for each of said operating points, at least one direct current resistance value of said at least one electrical energy storage element; and
   calculating, for each of said operating points, based on the direct current resistance value calculated for said operating point, at least one value of the resistive state of health of said at least one electrical energy storage element.

2. The method according to claim 1, wherein the step of measuring the variation in the strength and the voltage of an electric current is carried out during a dynamic driving cycle of the vehicle.

3. The method according to claim 1, wherein, during the step of determining at least one operating range for which the direct current resistance of said at least one electrical energy storage element changes linearly, said at least one determined operating range is an operating range for which the direct current resistance of said at least one electrical energy storage element changes linearly with respect to the state of charge of the storage element, of the temperature and of the strength of the electric current.

4. The method according to claim 1, wherein the method further comprises a step of verifying, for each of said operating points, at least one condition fulfilled by the strength and/or the voltage of the electric current generated by said at least one electrical energy storage element, said verification step being carried out between the determination step and the measuring step, the measurement of the variation of the strength and of the voltage of the generated electric current being carried out if said at least one condition is verified.

5. The method according to claim 4, wherein a first condition to be verified consists in the value of the strength of the electrical current generated being less than a threshold value close to zero over a first predefined period, and in that a second condition to be verified consists in the strength and the voltage of the generated electrical current each having a constant or quasi-constant value over a second predefined period.

6. The method according to claim 5, wherein a third condition to be verified consists in that, at the end of the second predefined period, the value of the strength of the generated electrical current is less than a threshold value of maximum strength, and/or in that the variation in the strength of the electric current between the start and the end of the second predefined period is greater than a threshold variation value.

7. The method according to claim 1, wherein the measuring step is carried out for several running phases of the vehicle, and in that the step of computing at least one resistive state of health value comprises a first phase of calculating, for each of said operating points, several intermediate resistive state of health values, each intermediate resistive state of health value being associated, for said operating point, with a running phase and with the measured strength variation value for this running phase, and a second phase of calculating, for each of said operating points, based on said intermediate resistive state of health values calculated for said operating point, a resistive state of health value of said at least one electrical energy storage element.

8. The method according to claim 7, wherein the second phase of calculating the step of calculating a resistive state of health value of said at least one electrical energy storage element consists in applying an average over all intermediate resistive state of health values calculated during the first calculation phase, and of weighting this average based on the strength variation values associated with said intermediate resistive state of health values.

9. The method according to claim 7, wherein the first calculation phase, for each running phase wherein a measurement is carried out, of an intermediate resistive state of health value, consists in dividing the calculated direct current resistance value for this running phase by a predetermined direct current resistance value at the start of life of the electric battery.

10. The method according to claim 1, wherein said at least one electrical energy storage element is selected from the group consisting of: an electrical energy storage cell, an electrical energy storage module consisting of several storage cells connected in series, and an electric battery consisting of several storage modules connected in series.

* * * * *